United States Patent
Tailliet et al.

(10) Patent No.: US 11,386,963 B2
(45) Date of Patent: Jul. 12, 2022

(54) EEPROM MEMORY DEVICE AND CORRESPONDING METHOD

(71) Applicant: STMicroelectronics (Rousset) SAS, Rousset (FR)

(72) Inventors: François Tailliet, Fuveau (FR); Marc Battista, Allauch (FR)

(73) Assignee: STMICROELECTRONICS (ROUSSET) SAS, Rousset (FR)

( * ) Notice: Subject to any disclaimer, the term of this patent is extended or adjusted under 35 U.S.C. 154(b) by 0 days.

(21) Appl. No.: 17/166,107

(22) Filed: Feb. 3, 2021

(65) Prior Publication Data

US 2021/0249086 A1    Aug. 12, 2021

(30) Foreign Application Priority Data

Feb. 6, 2020   (FR) ........................... 2001195

(51) Int. Cl.
| | |
|---|---|
| *G11C 16/04* | (2006.01) |
| *G11C 16/14* | (2006.01) |
| *G11C 16/26* | (2006.01) |
| *G11C 16/30* | (2006.01) |

(52) U.S. Cl.
CPC .......... *G11C 16/14* (2013.01); *G11C 16/0441* (2013.01); *G11C 16/26* (2013.01); *G11C 16/30* (2013.01)

(58) Field of Classification Search
CPC ..... G11C 16/14; G11C 16/0441; G11C 16/26; G11C 16/30
USPC ...................................... 365/185.29
See application file for complete search history.

(56) References Cited

U.S. PATENT DOCUMENTS

| | | | |
|---|---|---|---|
| 10,403,368 B2 | 9/2019 | Tailliet et al. | |
| 2004/0027894 A1* | 2/2004 | Lee ..................... | G11C 16/3404 257/E21.422 |
| 2004/0047203 A1* | 3/2004 | Lee ..................... | G11C 16/0408 257/E27.103 |
| 2011/0157974 A1 | 6/2011 | Lee et al. | |
| 2012/0063223 A1 | 3/2012 | Lee et al. | |
| 2018/0374551 A1* | 12/2018 | Hu ....................... | G11C 11/5628 |

FOREIGN PATENT DOCUMENTS

| | | | | |
|---|---|---|---|---|
| CN | 100423130 C | * | 10/2008 | ............. G11C 16/16 |
| CN | 107430875 A | * | 12/2017 | ......... G11C 16/0466 |
| EP | 1233421 A1 | * | 8/2002 | ......... G11C 16/3418 |
| FR | 3070537 A1 | | 3/2019 | |
| WO | WO-2016154144 A1 | * | 9/2016 | ......... G11C 16/0466 |

* cited by examiner

*Primary Examiner* — Ly D Pham
(74) *Attorney, Agent, or Firm* — Slater Matsil, LLP

(57) ABSTRACT

The memory device of the electrically-erasable programmable read-only memory type comprises write circuitry designed to carry out a write operation in response to receiving a command for writing at least one selected byte in at least one selected memory word of the memory plane, the write operation comprising an erase cycle followed by a programming cycle, and configured for generating, during the erase cycle, an erase voltage in the memory cells of all the bytes of the at least one selected memory word, and an erase inhibit potential configured, with respect to the erase voltage, for preventing the erasing of the memory cells of the non-selected bytes of the at least one selected memory word, which are not the at least one selected byte.

18 Claims, 5 Drawing Sheets

[Fig 1]
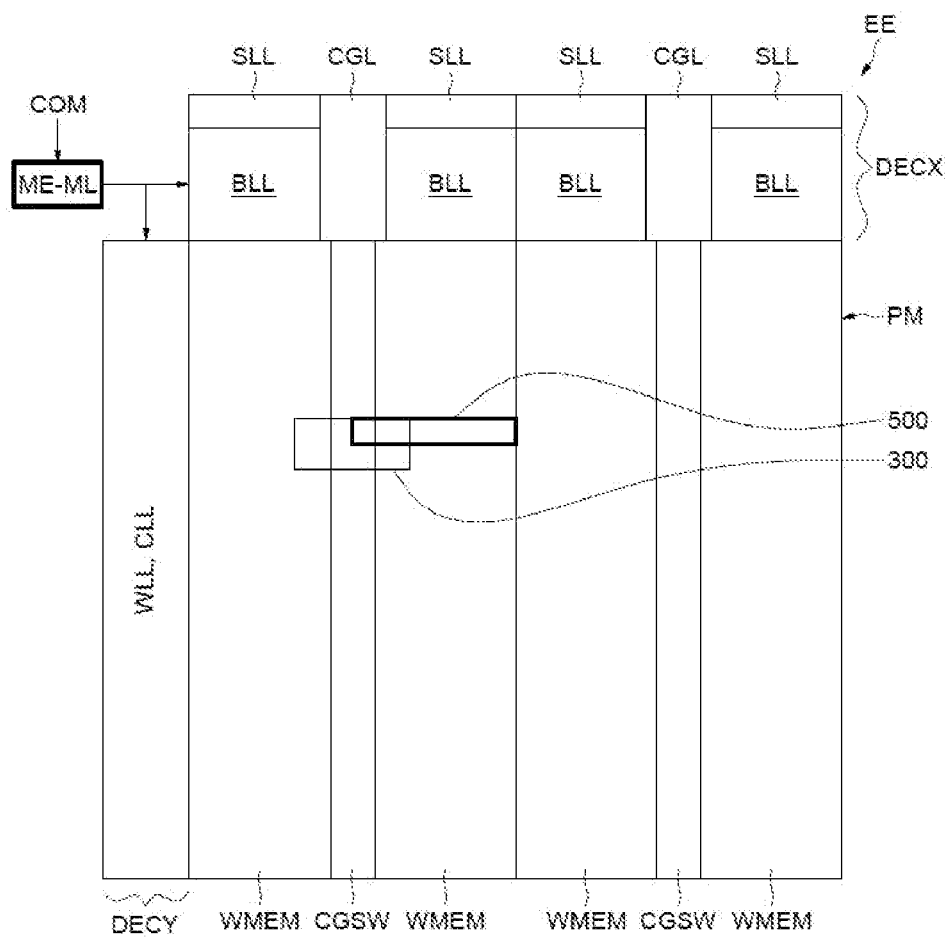

[Fig 2]
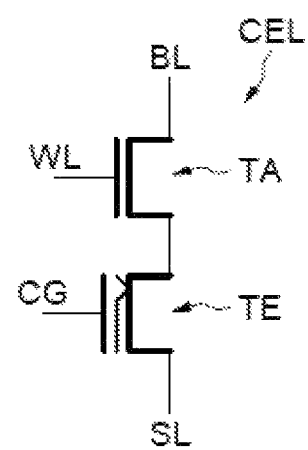

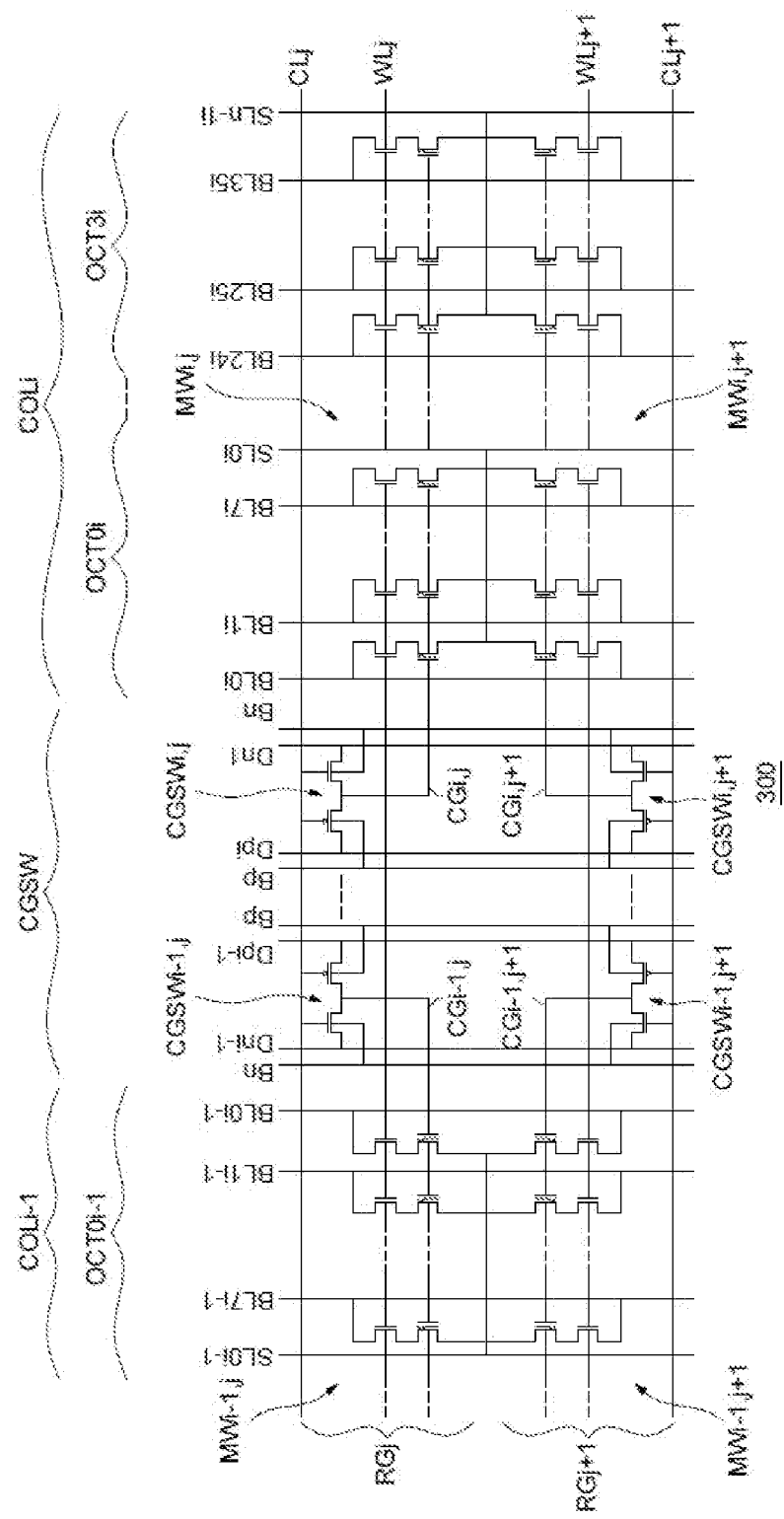
[Fig 3]

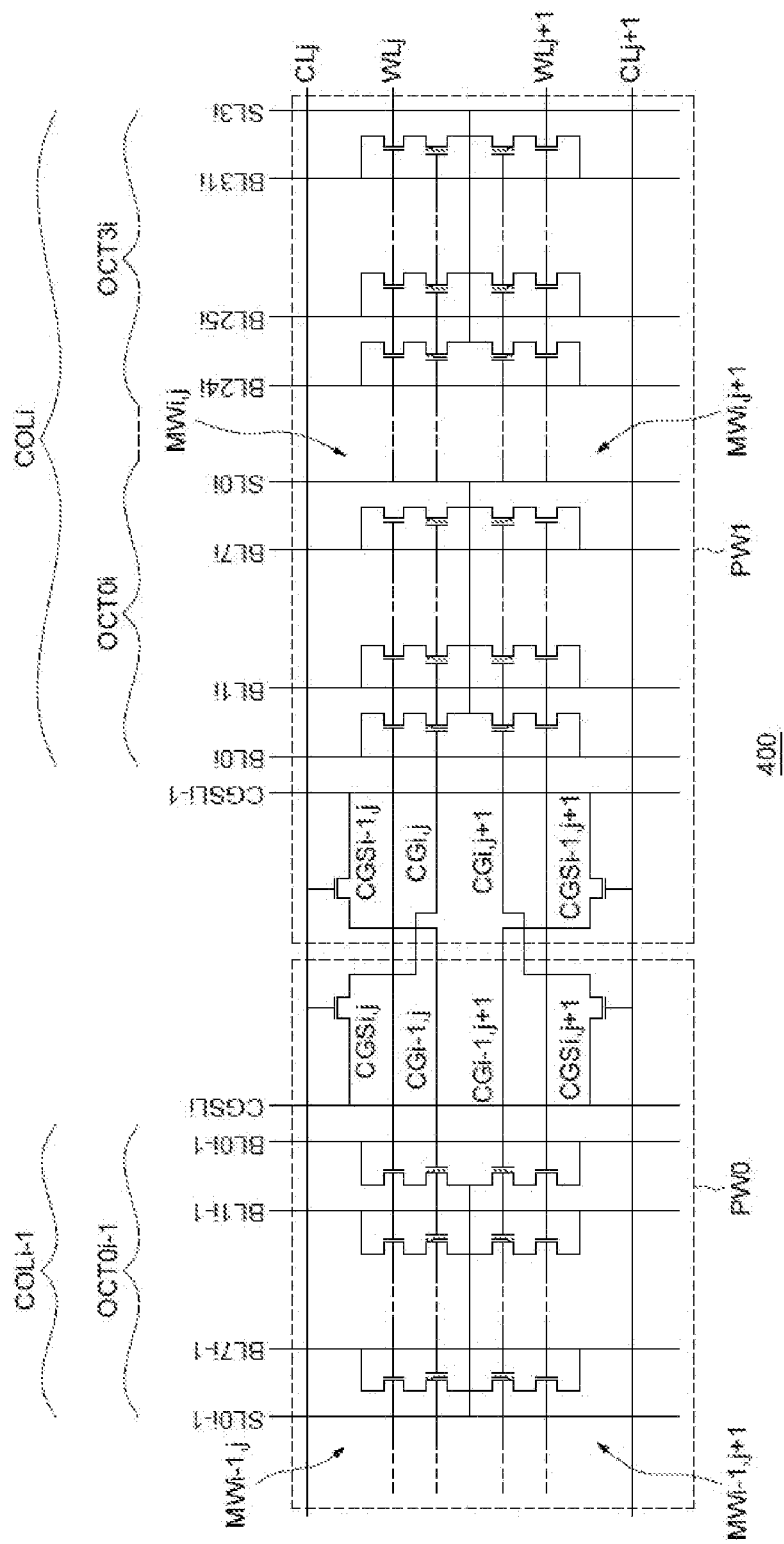
[Fig 4]

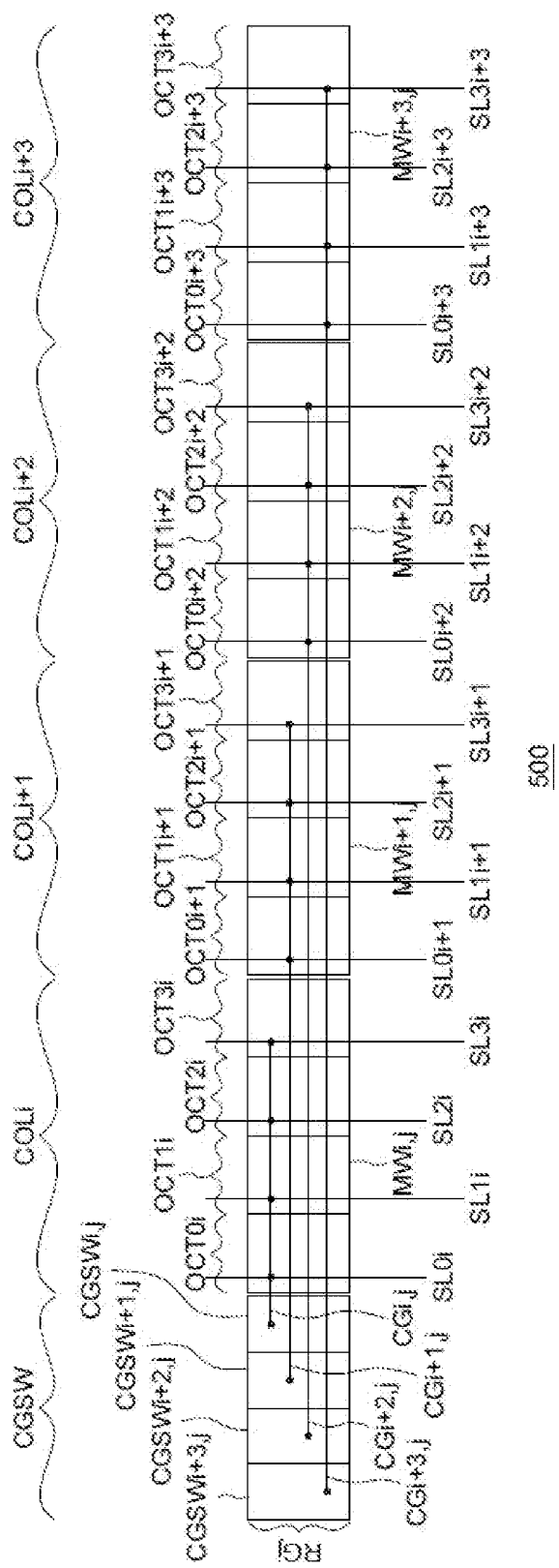
[Fig 5]

EEPROM MEMORY DEVICE AND CORRESPONDING METHOD

CROSS-REFERENCE TO RELATED APPLICATIONS

This application claims the benefit of French Application No. 2001195, filed on Feb. 6, 2020, which application is hereby incorporated herein by reference.

TECHNICAL FIELD

Embodiments and their implementation relate to integrated memory circuits and corresponding methods, in particular Electrically-Erasable Programmable Read Only Memories (EEPROMs) and corresponding methods.

BACKGROUND

In EEPROM memories, smaller memory cells and more compact high-voltage transistors may require more complex activation mechanisms occupying larger surface areas, which counteract the benefit of the reduction in size of the memory cells.

SUMMARY

For example, techniques known as shared voltage techniques, using a combination of positive and negative potentials for generating programming voltages, have allowed a shrinking of the memory cells to the detriment of a more complex control gate switching circuit, of the inverter type, requiring, as a consequence, wells with complementary dopings, which has increased the surface area occupied by these circuits. Conventionally, a control gate switching circuit is provided for each memory word, typically composed of a byte of memory cells.

The lower the memory density, in other words the greater the proportion of surface area occupied by the activation mechanisms with respect to the surface area occupied by the memory cells, the more serious the problem becomes.

It is desirable to overcome the extra cost in terms of surface area in order to obtain a real advantage on the reduction of the overall size and of the cost of the integrated circuits, or chips, of EEPROM memories.

One solution that has been provided is to share a control gate switching circuit for memory words composed of several bytes, for example four bytes, in order to limit the surface area occupied by the control gate switching circuits.

However, the grouping of several bytes in a memory word, for a control gate switching circuit, presents drawbacks in terms of life expectancy.

Indeed, it is advantageous for the EEPROM memory to have a "client" granularity of one byte, in other words the memory is designed to receive a write command only modifying a single byte, at least, in the memory plane.

However, the grouping of several bytes per memory word imposes a "physical" granularity of several bytes (for example 4), in other words the memory is only capable of modifying the bytes of the memory plane in groups of several bytes.

Conventionally, the operations for writing in a memory word erase all the bits of the memory word in a first phase, and selectively programme certain bits of the word in a second phase, depending on the data to be written.

In order to be able to provide a client granularity less than the physical granularity of the memory, during the writing of one byte, the other bytes of the same memory word are read, then re-written, in other words collectively erased then selectively programmed according to the data that they contained prior to being erased.

Consequently, if a number N of bytes are grouped in the same memory word, the worst acceleration factor for the stress of the memory cells is N. This divides by N the lifetime in number of write cycles, which amounts to dividing by N the real life expectancy of a memory cell in order to specify the nominal value of the life expectancy of a marketed product. In addition, a power cut during the write cycle corrupts the bytes in the process of being re-written into the memory word.

The specifications of the overall device in terms of life expectancy and of data retention are thus degraded with respect to the life expectancy and the retention of which an isolated memory cell is capable.

Embodiments and their implementation are provided to bring the acceleration factor close to 1 in architectures of the type of that described hereinabove, while at the same time fully benefiting from the advantages of reduction in surface area of this type of architecture.

In other words, the embodiments and their implementation provided allow the specifications as regards life expectancy and data retention to be improved in compact memory architectures.

According to one aspect, a memory device is provided of the electrically-erasable programmable read only memory type comprising a matrix memory plane arranged in rows and columns of memory words each comprising several bytes of memory cells, and writing means designed to carry out a write operation in response to receiving a command for writing at least one selected byte in at least one selected memory word from the memory plane, the write operation comprising an erase cycle followed by a programming cycle. Several selected bytes are typically consecutive, and potentially also consecutive with the bytes of several selected memory words.

According to one general feature of this aspect, the writing means are configured for generating, during the erase cycle, on the one hand an erase voltage in the memory cells of all the bytes of the at least one selected memory word, the erase voltage being designed to cause the memory cells to be erased, and on the other hand an erase inhibit potential configured relative to the erase voltage for preventing the erasing of the memory cells of the non-selected bytes of the at least one selected memory word.

It goes without saying that the non-selected bytes of a selected memory word are the bytes of this memory word which are not the selected bytes.

In other words, the idea is to inhibit the process of erasing the bytes of a memory word which are not replaced by new data to be written, and thus to avoid re-writing prior data that may degrade memory cells.

Thus, the nominal life expectancy of the memory is not divided by N (N being the number of bytes per memory word), and the risk of corruption of the non-modified data is non-existent.

According to one embodiment, the memory cells each comprise a floating gate state transistor capable of storing a data value, the sources of the state transistors being coupled to a source line common to the memory cells of the same byte and distinct from the source lines of the other bytes of the same memory word, the device comprising a source line decoder configured for selectively transmitting the erase inhibit potential in the source lines of the non-selected bytes of the at least one selected memory word.

In other words, each byte of a memory word has its individual source line, and the non-selected bytes are selectively inhibited on the source potential during the erase phases.

Since the shift of the threshold voltage of the memory cells (state transistors), from the programmed state to the erased state is typically from 3 to 4 volts, inhibit potentials are advantageously from 3 to 4 volts.

According to one embodiment, the state transistors comprise a control gate, the control gates of the state transistors being coupled to a control gate line common to the memory cells of the same memory word, and the writing means are configured for generating, during the erase cycle, the erase voltage on the control gate line(s) of the at least one selected memory word.

Thus, during an erase cycle, the erase voltage, typically of the order of 15 volts, is collectively applied to the control gates of the state transistors of the selected memory word. Advantageously, the sign of the erase voltage is biased so as to drive the state transistors into conduction (in other words is positively biased if the state transistors are of the type N).

Conventionally, a voltage between the floating gate and the drain of the state transistor at the level of the erase voltage causes an injection of charge (of a sign corresponding to the erased state) into the floating gate by the Fowler-Nordheim effect.

According to one embodiment, the writing means are configured for generating, during the erase cycle, a ground reference potential in the source line(s) of the at least one selected byte.

Consequently, the ground potential of the source line is transmitted to the drains of the state transistors of the selected bytes via the conducting channel region, whereas the inhibit potential is transmitted to the drains of the state transistors in the memory cells of the non-selected bytes. Thus, the erasing of the selected bytes is selectively effective, whereas the erasing of the non-selected bytes is selectively inhibited.

According to one embodiment, the device comprises reading means configured for reading, during a write operation and prior to the erase cycle, the data contained in the memory cells of the at least one non-selected byte of the at least one selected memory word, and the writing means are configured for generating, during the programming cycle, a programming voltage in the previously programmed memory cells of the at least one non-selected byte of the at least one selected memory word.

The reading means and the writing means comprise, for example, a logic part and an analogue part, where the logic part of the reading and writing means may be incorporated into the same circuit, for example a logic block called state machine.

Furthermore, for example, each memory cell is coupled to a bit line, and the writing means are configured for generating, during the programming cycle, the programming voltage on the bit lines of the memory cells to be programmed.

Indeed, the writing means may advantageously be configured for re-writing the non-selected bytes with the previous data that they contain prior to and during the erase cycle, because, depending on the embodiments, the inhibition can be partial or total. A succession of partially inhibited erase cycles in non-selected bytes can eventually lead to an erased state of the memory cells, it is thus advantageous to provide the re-writing operations in the non-selected bytes.

However, in this embodiment, the degradation of the memory cells caused by the re-writing operations in completely erased memory cells is lower with respect to the degradation caused by full re-writing operations in completely erased cells. Indeed, the acceleration factor of the stress on a memory cell (in other words the degradation of the life expectancy) is linked to the amplitude of the variations of the threshold voltage of the state transistor and to the fact that these variations are in both erase-programming directions, in other words from the programmed state to the erased state, then from the erased state to the programmed state. However, a partial inhibition leads to an incomplete erasing and reduces this amplitude in both directions (programmed towards erased and erased towards programmed). The reduction in the amplitude of the variations of the threshold voltage, for example by a factor 4, reduces the degradation of the life expectancy accordingly.

According to one embodiment, the reading means are configured for reading the previous data and measuring a quantification of the programming of the previously programmed memory cells in the at least one non-selected byte of the at least one selected memory word, and the writing means are configured for generating the programming voltage in the previously programmed memory cells of the at least one non-selected byte of the at least one selected memory word, if the quantification of the programming measured in these memory cells is less than a margin taken on a nominal value of the quantification of the programming.

In other words, in this embodiment the reading means are configured for testing whether the programmed states of the memory cells of the non-selected bytes have undergone an alteration, for example because of incomplete erasures, in order to condition a re-writing of the memory cells relative to a margin. This allows the number of re-writings to be limited, so as to limit the number of actions able to degrade (even in a lesser manner) non-selected bytes.

The quantification of the programming and the margin value may for example correspond to measurements of the value of the threshold voltages of the state transistors in the programmed state, the nominal value of the quantification being able to correspond to the threshold voltage of a correctly programmed state transistor.

According to one embodiment, the erase inhibit potential is configured so as to result, with respect to the erase voltage, in an erase alteration in the memory cells of the non-selected bytes of the at least one selected memory word, causing an incomplete erasing of these memory cells, so as to prevent the complete erasing of the memory cells.

According to another embodiment, the erase inhibit potential is configured so as to result, with respect to the erase voltage, in a negligible erase alteration in the memory cells of the non-selected bytes of the at least one selected memory word, causing a negligible partial erasing of these memory cells, so as to prevent the erasing of the memory cells.

This other embodiment may be combined with the embodiments providing the generation of the programming voltage in the previously programmed memory cells of the at least one non-selected byte, because an over-programming of a memory cell in the programmed state (the erase alteration having a negligible effect) does not reasonably lead to any wear in this memory cell.

Nevertheless, a repetition of a very large number of partial erasures, although individually negligible, may lead to an alteration of the programmed state of a memory cell. Although theoretically exceptional, such a situation is covered by the embodiments providing the generation of the programming voltage in the previously programmed memory cells of the non-selected bytes, and advantageously, in a manner conditioned by the measurement of the quantification of the programming.

An integrated circuit is also provided incorporating a memory device such as defined hereinabove.

According to another aspect, a method is also provided for writing in a memory of the electrically-erasable programmable read only memory type comprising a matrix memory plane arranged in rows and columns of memory words each comprising several bytes of memory cells, comprising, in response to receiving a command for writing at least one selected byte in at least one selected memory word of the memory plane, a write operation comprising an erase cycle followed by a programming cycle, in which the erase cycle comprises, on the one hand, the generation of an erase voltage in the memory cells of all the bytes of the at least one selected memory word, the erase voltage being able to cause the memory cells to be erased, and, on the other hand, the generation of an erase inhibit potential configured with respect to the erase voltage for preventing the erasing of the memory cells of the non-selected bytes of the at least one selected memory word.

According to one embodiment in which the memory cells of the memory each comprise a floating gate state transistor capable of storing a data value, the sources of the state transistors being coupled to a source line common to the memory cells of the same byte and distinct from the source lines of the other bytes of the same memory word, the method comprises a decoding of source lines in order to selectively transmit the erase inhibit potential in the source lines of the non-selected bytes of the at least one selected memory word.

According to one embodiment in which the state transistors comprise a control gate, the control gates of the state transistors being coupled to a control gate line common to the memory cells of the same memory word, the erase cycle comprises the generation of the erase voltage on the control gate line(s) of the at least one selected memory word.

According to one embodiment, the erase cycle comprises the generation of a ground reference potential in the source line(s) of at least the selected byte.

According to one embodiment, the write operation comprises, prior to the erase cycle, a reading of the data contained in the at least one non-selected byte of the at least one selected memory word and, during the programming cycle, the generation of a programming voltage in the previously programmed memory cells of the at least one non-selected byte of the at least one selected memory word.

According to one embodiment, each memory cell is coupled to a bit line, and the programming cycle comprises the generation of the programming voltage on the bit lines of the memory cells to be programmed.

According to one embodiment, the write operation comprises the reading and a measurement of a quantification of the programming of the previously programmed memory cells in the at least one non-selected byte of the at least one selected memory word, and the generation of the programming voltage in the previously programmed memory cells of the at least one non-selected byte of the at least one selected memory word, if the quantification of the programming measured in these memory cells is less than a margin taken on a nominal value of the quantification of the programming.

According to one embodiment, the erase inhibit potential is configured so as to result, with respect to the erase voltage, in an erase alteration in the memory cells of the non-selected bytes of the at least one selected memory word, causing an incomplete erasing of these memory cells, in order to prevent the complete erasing of the memory cells.

According to one embodiment, the erase inhibit potential is configured so as to result, with respect to the erase voltage, in a negligible erase alteration in the memory cells of the non-selected bytes of the at least one selected memory word, causing a negligible partial erasing of these memory cells, in order to prevent the erasing of the memory cells.

BRIEF DESCRIPTION OF THE DRAWINGS

Other advantages and features of the invention will become apparent upon examining the detailed description of non-limiting embodiments and their implementation and from the appended drawings, in which:

FIG. 1 illustrates an EEPROM including a memory plane;

FIG. 2 illustrates a memory cell of the memory plane of FIG. 1;

FIG. 3 illustrates a portion of the memory plane of FIG. 1;

FIG. 4 illustrates a portion of a memory plane of a compact memory device; and

FIG. 5 illustrates a portion of the memory plane of FIG. 1.

DETAILED DESCRIPTION OF ILLUSTRATIVE EMBODIMENTS

FIGS. 1 to 5 will now be described, where common references in the figures denote the same elements, or elements of analogous functions in different embodiments. When a figure is described, reference could be made to an element not shown but described in relation with another figure showing it.

Generally speaking, in relation to FIGS. 1 to 5, an index "i" in the references indicates that the element referenced belongs to the column of index "i", and an index "j" in the references indicates that the element referenced belongs to the row of index "j". The indices may be incremented or decremented "i−1", "j+1", etc. and indicate that the element referenced belongs to the column or the row with the respectively incremented index.

FIG. 1 shows an electrically-erasable programmable non-volatile memory device EE of the EEPROM (Electrically Erasable Programmable Read Only Memory) type, which may be fabricated in an integrated circuit in the form of an integrated circuit chip.

The memory device EE comprises a matrix memory plane PM, comprising memory cells CEL (FIG. 2) each capable of storing a binary data value. The memory cells CEL are organized in memory words, arranged in rows RGj (FIGS. 3 to 5) and in columns COLi (FIGS. 3 to 5) in word regions MWEM of the memory plane PM. A memory word MWi,j (FIGS. 3 to 5) is at the single intersection between a column COLi and a row RGj of the memory plane PM. In summary, the access to a memory word MWi,j is carried out by matrix selection on the columns COLi and the row RGj to which it belongs.

Consequently, the physical granularity of the memory, in other words the smallest unit modified in a write operation, is defined by a memory word.

On the periphery of the memory plane PM, the memory device EE comprises writing means ME, reading means ML, a column decoder DECX and a row decoder DECY.

The reading means ML and the writing means ME comprise a logic part and an analogue part, the logic part of the reading and writing means may be incorporated into the same circuit, for example a logic block referred to as state machine (not shown).

The state machine is a unit for control and management of the device EE, and is configured for receiving a command COM coming from outside the memory device EE, referred to as user command. The user command COM may comprise a command for writing one byte as a minimum, and one complete page as a maximum. One byte is a group of eight memory cells, a page corresponds to one entire row of memory cells.

Thus, the "client" granularity of the memory, in other words the smallest unit modifiable in a write command is one byte.

However, in order to limit the space occupied by control gate switching circuits CGSW (see hereinafter), the memory words MWi,j of the memory plane PM comprise at least two bytes of memory cells.

Consequently, the physical granularity of the memory (one memory word) is greater than the client granularity (one byte) for a write operation.

The bytes to be written are referred to as selected bytes, and the memory words comprising the bytes to be written are referred to as selected memory words. Typically, a write command COM comprises the address of the first byte and the data to be written starting from this address of the memory plane PM.

The state machine is configured for decoding the addresses of the command into physical coordinates of the arrangement of the memory plane PM, and for respectively controlling the column decoder DECX and row decoder DECY.

The writing means ME are configured for carrying out a write operation in response to the receipt of the write command COM. The write operation comprises a collective erase cycle on all the memory cells of the selected memory word(s), followed by a selective programming cycle on each memory cell to be programmed depending on the data to be written.

The writing means ME are configured for generating erase and programming stimuli and for transmitting them to the memory cells of the memory plane PM via the column decoders DECX and the row decoders DECY.

FIG. 2 shows a memory cell CEL of the memory plane PM (FIG. 1). The memory cell CEL comprises a state transistor TE, of the NMOS type, having a floating gate and a control gate, and an access transistor TA, of the NMOS type, having a simple gate.

The state transistor TE and the access transistor TA are coupled in series, the drain of the state transistor TE being coupled to the source of the access transistor TA.

The drain of the access transistor TA is coupled to a bit line BL, whereas the source of the state transistor TE is coupled to a source line SL.

The gate of the access transistor TA is coupled to a word line WL, and the control gate of the state transistor TE is coupled to a control gate line CG.

In order to erase a memory cell CEL, a voltage high enough to inject charges by the Fowler-Nordheim effect into the floating gate of the state transistor TE is applied between the control gate CG and the drain of the state transistor TE. Such an erase voltage is typically of the order of 15V between the gate and the drain, positively on the gate, and the injected charges are of negative sign. An erase voltage, for example of 15V, is applied to the control gate CG of the state transistor TE, and the potential on the drain of the state transistor TE, for example ground, is transmitted from the source line SL via the channel region of the state transistor TE thus controlled to be conducting.

As will be seen hereinafter, notably in relation to FIG. 5, an erase inhibit potential, for example of 3V or 4V, is transmitted on the source line SL, and for an unchanged erase voltage of 15V on the control gate CG of the state transistor TE. Thus, the voltage resulting from this between the control gate and the drain of the state transistor TE is substantially 12V or, respectively, 11V. Gate—drain voltages of the order of 12V or 11V are insufficient to cause an injection of charges by effect Fowler-Nordheim, or at least for injecting charges with a quantity sufficient to result in a complete erasing of the memory cell CEL.

In other words, the erase inhibit potential, for example transmitted on the source line SL of a memory cell, is configured with respect to the erase voltage so as to prevent the erasing of the memory cell CEL.

In order to programme a memory cell CEL, a voltage sufficient for injecting charges by the Fowler-Nordheim effect into the floating gate of the state transistor TE is applied between the control gate CG and the drain of the state transistor TE. Such a programming voltage is typically of the order of −15V between the gate and the drain, negatively on the gate, and the injected charges are consequently of positive sign.

In a technique known as a shared voltage technique, a negative programming potential, for example of −7V, is applied to the control gate CG of the state transistor TE and a positive programming potential, for example of +8V, is applied to the drain of the state transistor TE from the bit line BL via the access transistor TA controlled to be conducting by a control voltage, for example of boy, transmitted on the word line WL.

In a technique that does not provide the generation of negative potentials, a ground potential is applied to the control gate CG and a positive programming potential, for example of +15V, is applied to the drain of the state transistor TE from the bit line BL via the access transistor TA controlled to be conducting by a control voltage, for example of 17V, transmitted on the word line WL.

FIG. 3 shows a portion 300 of the memory plane PM in FIG. 1, illustrating, in particular, a memory word MWi,j belonging to the row RGj and to the column COLi.

The memory word MWi,j+1 belonging to the row RGj+1 and to the column COLi, and one byte OCT0i−1 of the memory words MWi−1,j and MWi−1,j+1 belonging to the column COLi−1 and, respectively, to the rows RGj, RGj+1 are also shown.

Each memory word MWi,j, comprises at least two bytes OCT0i-OCT3i, for example 4 bytes, of eight memory cells CEL each.

In the following part, the phrase "coupling of a memory cell to an element" is understood to mean the coupling with the corresponding element such as shown hereinbefore in relation to FIG. 2.

Each memory cell is coupled to a dedicated and individual bit line BL0i, BL1i, . . . , BL7i, . . . , BL24i, BL25i, . . . , BL31i, for the column COLi (BL0i−1, BL1i−1, . . . , BL7i−1, . . . for the column COLi−1).

The bit lines BL are nevertheless coupled with the respective memory cells of each other row RGj+1.

The memory cells CEL of the same byte OCT0i, . . . , OCT3i (and OCT0i−1) are coupled to a common and dedicated source line SL0i, . . . , SL3i (and SL0i−1) for each byte.

In a noteworthy manner, the sources of the state transistors TE are thus coupled to a source line SL0i common to the memory cells of the same byte OCT0$i$ and distinct from the source lines of the other bytes OCT1$i$-OCT3$i$ of the same memory word MWi,j.

The source lines SL0$i$, ..., SL3$i$ are nevertheless coupled with the respective bytes OCT0$i$, ..., OCT3$i$ of the other rows RGj+1.

All the memory cells of the same row RGj, RGj+1 are coupled to a word line WLj, WLj+1, common and dedicated to each row.

The memory cells of the same memory word MWi,j MWi,j+1 MWi−1,j MWi−1,j+1 are coupled to a common control gate line CGi,j CGi,j+1 CGi−1,j CGi−1,j+1. Each control gate line CGi,j is exclusively dedicated to one memory word MWi,j of a column COLi and of a row RGj.

The access (decoding) to a control gate line CGi,j CGi,j+1 CGi−1,j CGi−1,j+1 in the memory plane PM is gained by means of a control gate switching circuit CGSWi,j CGSWi,j+1 CGSWi−1,j CGSWi−1,j+1 situated in a region CGSW of the memory plane PM close to the respective memory words MWi,j MWi,j+1 MWi−1,j MWi−1,j+1.

Each control gate switching circuit CGSWi,j comprises an inverter circuit comprising a PMOS transistor and an NMOS transistor, controlled by a control signal on their gates. Well biasing lines Bn, Bp allow the complementary wells containing the PMOS and NMOS transistors to be biased, in the region CGSW of the memory plane PM, in a manner adapted to the routed signals (Dpi, Dni, see hereinbelow).

The control signal is transmitted on a control line CLj, CLj+1, common and dedicated to each row RGj, RGj+1.

The drains of the complementary transistors of the inverters of the respective switching circuits CGSWi,j CGSWi−1,j are coupled to biasing lines Dpi, Dni, Dpi−1, Dni−1, common and dedicated for each of the columns COLi, COLi−1.

The sources of the complementary transistors of the inverters of the switching circuits CGSWi,j are coupled to the respective control gate lines CGi,j.

Thus, the control line CLj of the row RGj and the biasing lines Dpi, Dni of the column COLi allow a bias potential to be selectively transmitted on the control gate line CGi,j of the memory word MWi,j belonging to the column COLi and to the row RGj.

Such control gate switching circuits CGSWi,j occupy a non-negligible surface area, notably owing to the presence of wells with the complementary dopings, and, in order to limit the number of control gate switching circuits, several bytes OCT0$i$-OCT3$i$ have been grouped within each memory word MWi,j to the detriment of a physical granularity greater than 1 byte.

It will be noted that the bias potential on the control gate line CGi,j can be of positive or negative sign, by using a complementary circuit of the inverter type in the control gate switching circuits CGSWi,j.

This enables the shared-voltage writing techniques.
Reference is again made to FIG. 1.

The row decoders DECY comprise word-line locks WLL configured for distributing signals in the word-lines WLj of the memory plane PM; and control-line locks CLL configured for distributing signals in control lines CLj controlling the control gate switches CGSWi,j of each row RGj of the memory plane PM.

The column decoders DECX comprise bit-line locks BLL configured for distributing signals in the various bit lines BL0$i$-BL32$i$ of the memory plane PM; source-line locks SLL configured for distributing signals in the various source lines SL0$i$-SL3$i$ of the memory plane PM; and control gate signal locks CGL configured for distributing control gate line bias potentials Dpi, Dni to the control gate switches CGSWi,j of each column COLi of the memory plane PM.

The control gate switches CGSWi,j are situated in the memory plane PM, in mid-regions CGSW comprising complementary doping wells. The mid-regions are surrounded by word regions WMEM of the memory plane PM. The word regions WMEM comprise the memory cells grouped by memory words. In the example in FIG. 1, two mid-regions of control gate switches CGSW are provided, each being situated in the middle (in the direction of the rows) of one half of the total surface area of the word regions MWEM of the memory plane PM.

The regions of control gate switches CGSW, such as previously described in relation to FIGS. 1 to 3, occupy a non-negligible surface area but advantageously allow shared voltage writing operations.

The shared voltage technique allows the size of the memory cells to be reduced, which can compensate for the surface area occupied by the control gate switches CGSW for high-density memories.

FIG. 4 illustrates a portion 400 of memory plane of one example of a memory of the type of that described in the publication FR 3070537 A1, describing a compact device in which the surface area occupied by the control gate switching circuits CGSi,j is reduced.

The architecture of the portion 400 of the memory plane is identical to the architecture of the portion 300 of the memory plane PM previously described in relation to FIGS. 1 to 3, except as regards the control gate switching circuits CGSi,j CGSi,j+1 CGSi−1,j CGSi−1,j+1.

Indeed, in this example, each control gate switching circuit comprises a single control gate selection transistor, each control gate selection transistor being accommodated within and on a semiconductor well PW1, PW0 neighbouring the semiconductor well PW0, PW1 accommodating the memory word WDi,j to which it is assigned.

The wells PW0, PW1 in FIG. 4 may correspond to two word regions WMEM previously described in relation to FIG. 1.

Thus, in each of the two rows RGj, RGj+1, the control gate selection transistors CGSi,j CGSi,j+1, assigned to memory words MWi,j MWi,j+1, are accommodated in the well PW0 neighbouring the well PW1, the well PW0 accommodating the memory words MWi−1,j MWi−1,j+1.

Conversely, the control gate selection transistors CGSi−1,j CGSi−1,j+1, assigned to the memory words MWi−1,j MWi−1,j+1 are accommodated in the well PW1 neighbouring the well PW0, the well PW1 accommodating the memory words MWi,j MWi,j+1.

Each well PW0, PW1 can accommodate several memory words belonging to several columns (within the same row RGj), as for example illustrated hereinafter in relation to FIG. 5, or as notably described in relation to FIG. 4 of the publication FR 3070537 A1.

Furthermore, each memory word MWi,j comprises several bytes OCT0$i$-OCT3$i$ of memory cells, connected to individual bit lines BL0$i$-BL31$i$, word-lines WLj, and control gate lines CGi,j, such as previously described in relation to FIG. 3; the same elements consequently carry the same references.

The control gate selection transistors are controlled by a control line CLj, CLj+1 common to the whole row RGj, RGj+1, respectively, and for transmitting a signal transmitted on biasing control gate lines CGSLi, CGSLi−1, dedicated to each column COLi, COLi−1, to the control gate lines CGi,j CGi−1,j CGi,j+1 CGi−1,j+1.

In contrast to the device described in the publication FR 3070537 A1, in this embodiment, the sources of the state transistors TE are coupled to a source line SL0$i$ common to the memory cells of the same byte OCT0$i$ and distinct from the source lines of the other bytes OCT1$i$-OCT3$i$ of the same memory word MWi,j.

The source decoders SLL such as described in relation to FIG. 1 are also provided, forming a memory device EE such as illustrated by FIG. 1, but more compact owing to the absence of the mid-regions CGSW in the memory plane PM and to simpler, and hence smaller, control gate signal locks CGL.

In summary, a memory device EE has been described in relation to FIGS. 1 to 4 comprising a matrix memory plane PM arranged in rows RGj and columns COLi of memory words MWi,j each comprising several bytes OCT0$i$-OCT3$i$ of memory cells CEL. Writing means ME are designed to carry out a write operation in response to receiving a write command COM for at least one selected byte OCT0$i$-OCT1$i$ in at least one selected memory word MWi,j of the memory plane PM, the write operation comprising an erase cycle followed by a programming cycle. The writing means ME are configured for generating, during the erase cycle, an erase voltage in the memory cells CEL of all the bytes OCT0$i$-OCT3$i$ of the at least one selected memory word MWi,j, the erase voltage being designed to cause the memory cells to be erased.

According to a general feature of the memory device EE, and as will be seen in more detail hereinafter in relation to FIG. 5, the writing means ME are configured for generating, furthermore, during the erase cycle, an erase inhibit potential in the memory cells of the non-selected bytes OCT2$i$-OCT3$i$ of the at least one selected memory word MWi,j, which are not the at least one selected byte OCT0$i$-OCT1$i$.

The erase inhibit potential is configured with respect to the erase voltage for preventing the erasing of the memory cells of the non-selected bytes OCT2$i$-OCT3$i$ of the at least one selected memory word MWi,j.

The memory cells CEL each comprise a floating gate state transistor TE capable of storing a data value, the sources of the state transistors being coupled to a source line SL0$i$ common to the memory cells of the same byte OCT0$i$ and distinct from the source lines of the other bytes OCT1$i$-OCT3$i$ of the same memory word MWi,j.

The source line decoder SLL advantageously allows the erase inhibit potential to be selectively transmitted in the source lines SL2$i$-SL3$i$ of the non-selected bytes OCT2$i$-OCT3$i$ of the at least one selected memory word MWi,j.

FIG. 5 illustrates schematically a portion 500 of the memory plane PM in FIG. 1 comprising, in particular, the control gate switches CGSW dedicated to the memory words MWi,j-MWi+3,j situated in a word region MWEM, together with the corresponding memory words MWi,j-MWi+3,j, and along a single row RGj.

In this example, a word region WMEM contains four memory words MWi,j, MWi+1,j MWi+2,j MWi+3,j in four respective columns COLi, COLi+1 COLi+2 COLi+3.

The number of memory words per word region WMEM (here 4) is essentially limited by the interconnections needed to route the control gate lines CGLi,j to the respective memory words MWi,j. The more levels of interconnections in the integrated circuit there are, and/or the more the pitch of the interconnections is reduced (the pitch of the interconnections corresponds to the width of a metal track and the distance between two adjacent tracks), the larger the number of memory words per word region WMEM could be.

It is recalled that each memory word MWi,j-MWi+3,j comprises four bytes OCT0$i$-OCT3$i$-OCT0$i$+3-OCT3$i$+3, and one control gate switching circuit CGSWi,j CGSWi+1,j CGSWi+2,j CGSWi+3,j is dedicated to each memory word and is configured for transmitting voltages on the respective control gate lines CGi,j CGi+1,j CGi+2,j CGi+3,j.

It is also recalled that a source line SL0$i$ is provided that is common to the memory cells of the same byte OCT0$i$ and distinct from the source lines SL1$i$ SL2$i$ SL3$i$ of the other bytes OCT1$i$ OCT2$i$ OCT3$i$ of the same memory word MWi,j.

It will be noted that, on the drawing in FIG. 5, the points at the intersections between a source line, for example SL0$i$, and a control gate line, for example CGi,j, do not show a coupling between these two lines, but show a coupling of each of these two lines with the memory cells of the corresponding byte, in this example OCT0$i$, in the manner previously described in relation to FIGS. 2 to 4.

One embodiment of a method for writing in a memory device EE such as previously described in relation to FIGS. 1 to 4, will now be described in relation to FIG. 5.

The writing means ME (FIG. 1) are configured for carrying out a write operation comprising an erase cycle followed by a programming cycle, in response to receiving a write command COM.

The user command COM may comprise a write command for at least one selected byte in at least one selected memory word, up to an entire page at the most.

The selected bytes will be written with new data transmitted in the command COM.

The addresses of the selected bytes are typically consecutive in the same row, from the first to the last selected byte. It is preferable for the bytes of consecutive addresses to be physically arranged consecutively in the memory plane, without this however being necessary.

According to a first example, in the write command, the selected bytes are the first two bytes OCT0$i$ and OCT1$i$ of the memory word MWi,j. The selected memory word is MWi,j.

In the selected memory word MWi,j, the non-selected bytes OCT2$i$ OCT3$i$ are the bytes which are not the selected bytes OCT0$i$ OCT1$i$.

The erase cycle comprises the generation of an erase voltage, for example of 15V, on the control gate line CGi,j of the selected memory word MWi,j, and hence in all the bytes OCT0$i$-OCT3$i$ of the selected memory word MWi,j, via the control gate switching circuit CGSWi.

At the same time, a ground reference potential is generated in the source lines SL0$i$ SL1$i$ of the selected bytes OCT0$i$ OCT1$i$; and an erase inhibit potential, for example of 3V, is generated in the source lines SL2$i$ SL3$i$ of the non-selected bytes OCT2$i$ OCT3$i$.

With reference to the example of programming cycle previously described in relation to FIG. 2, such an erase voltage is able to erase the memory cells, whereas such an erase inhibit potential allows the complete erasing of the memory cells of the non-selected bytes OCT2$i$ OCT3$i$ of the selected memory word MWi,j to be prevented.

For example, the source line locks SLL allow the decoding selectively transmitting the erase inhibit potential and the ground voltage in the respective source lines, depending on the command re-transcribed by the state machine and the writing means ME (FIG. 1).

In this first example, the erase inhibit potential of 3V is configured so as to result, with respect to the erase voltage of 15V, in an erase alteration in the memory cells of the non-selected bytes OCT2$i$ OCT3$i$.

The erase alteration does not result in a complete erasing of the memory cells, but causes an incomplete erasing of these memory cells, which do not completely lose their programmed state (if this was the case).

Indeed, under these conditions, the previously programmed cells had a threshold voltage typically of −1.5V prior to the erase alteration and have a threshold voltage typically of −0.5V after the erase alteration, whereas a complete erasing results in a threshold voltage typically at +2.5V.

After the erase cycle, the programming cycle comprises the generation of a programming voltage on the bit lines BL0$i$-BL31$i$ selectively for the memory cells to be programmed, and on the control gate line CG$i$,j according to one of the ways previously described in relation to FIG. 2.

The memory cells to be programmed are conventionally the memory cells intended to store a "1".

On the one hand, the memory cells of the selected bytes OCT0$i$ OCT1$i$ are thus selectively programmed according to the data of the write command.

On the other hand, the previously programmed memory cells of the non-selected bytes OCT2$i$ OCT3$i$ of the selected memory word MW$i$,j are programmed once again.

For this purpose, the device EE comprises conventional reading means ML, configured for reading, prior to the erase cycle, the data contained in the non-selected bytes OCT2$i$ OCT3$i$.

Thus, all the cells programmed with a "1" end up with a threshold voltage typically of −1.5V.

The aging of these cells is determined by the two shifts in the threshold voltage of +1V and −1V during the erase-programming cycles. By virtue of the inhibiting of the erase, this shift is 4 times lower than a situation in which the erase is complete (i.e. from −1.5V to +2.5V then from +2.5V to −1.5V consisting of shifts of +4V and −4V).

According to a second example, in the write command, the selected bytes are all the consecutive bytes from OCT3$i$+1 to OCT0$i$+3 (in other words the bytes OCT3$i$+1, OCT0$i$+2, OCT1$i$+2, OCT2$i$+2, OCT3$i$+2, OCT0$i$+3). The selected memory words are therefore MW$i$+1,j MW$i$+2,j and MW$i$+3,j.

In the selected memory words MW$i$+1,j MW$i$+2,j MW$i$+3,j, the non-selected bytes are the bytes OCT0$i$+1 OCT1$i$+1 OCT2$i$+1 and OCT1$i$+3 OCT2$i$+3 OCT3$i$+3.

In an analogous manner, the erase cycle comprises the generation of the erase voltage of 15V on the control gate line CG$i$+1,j CG$i$+2,j CG$i$+3,j of the selected memory words MW$i$+1,j MW$i$+2,j MW$i$+3,j, via the control gate switching circuits CGSW$i$+1 CGSW$i$+2 CGSW$i$+3.

At the same time, the ground reference potential is generated in the source lines SL3$i$+1, SL0$i$+2, SL1$i$+2, SL2$i$+2, SL3$i$+2, SL0$i$+3 of the selected bytes OCT3$i$+1-OCT0$i$+3; and an erase inhibit potential, for example this time of 4V, is generated in the source lines SL0$i$+1, SL1$i$+1, SL2$i$+1 and SL1$i$+3, SL2$i$+3, SL3$i$+3 of the non-selected bytes OCT0$i$+1, OCT1$i$+1, OCT2$i$+1, and OCT1$i$+3, OCT2$i$+3, OCT3$i$+3.

In this second example, the erase inhibit potential of 4V is configured so as to result, with respect to the erase voltage of 15V, in a negligible erase alteration in the memory cells of the non-selected bytes.

The negligible erase alteration causes a negligible partial erasing of these memory cells, preventing the erasing of the memory cells which thus keep their programmed state (if this were the case).

Indeed, under these conditions, the previously programmed cells had a threshold voltage typically of −1.5V prior to the erase alteration and have an unchanged threshold voltage after the erase alteration, whereas a complete erasing results in a threshold voltage at typically +2.5V.

After the erase cycle, a programming cycle such as described in relation to FIG. 2 may be implemented.

In a first alternative, the programming is implemented only in the selected bytes, given that the memory cells of the non-selected bytes have not been modified.

According to a second alternative, a programming such as described in relation with the first example is implemented, on the one hand in the selected bytes with the new data to be written, on the other hand in the non-selected bytes with the old data that they contained.

Indeed, negligible erase alteration effects in very large number could lead to an erased state of the memory cells, and this alternative prevents such a situation from occurring.

In this case, all the cells previously programmed with a "1" end up with a threshold voltage typically of −2V.

The shift of the threshold voltage is, on the one hand, of low amplitude (0.5V) and, on the other hand, varies monotonically (programming on a memory cell in the programmed state).

Accordingly, the aging of these cells is zero.

If the operation is repeated, the cells may be programmed once again with a threshold voltage typically of −2.5V, etc.

Subsequently, the inhibit potential of 4V no longer completely inhibits the erase operation, an alteration effect similar to that of the first example takes place during the erase phase, and an equilibrium is reached at −2.5V for the programmed threshold voltages.

According to a third alternative, the generation of the programming voltage in the previously programmed memory cells of the non-selected bytes of the selected memory words is conditioned by a measurement of the quantification of the programming of the memory cells, with respect to a margin taken on a nominal value of the quantification of the programming.

For example, the nominal value is the value of the threshold voltage of a memory cell programmed normally at −1.5V, and the margin is for example 1V, the condition then being fulfilled for any measurement of the threshold voltage greater than −0.5V in the programmed state.

The write operation comprises, in this regard, a measurement of the quantification of the programming, typically a measurement of the threshold voltage of the previously programmed memory cells in the non-selected bytes.

Such a measurement of the quantification corresponds, for example, to a read in 'margin mode', typically provided in the reading means ML of EEPROM memories.

This third alternative allows the number of re-writing operations to be limited and exhibits a zero aging of the non-selected cells, and without any risk of corruption of the data.

The first, second and third alternatives each have advantages and drawbacks. The second alternative is notably better for the reduction of the aging, and with no danger of corruption of the data. Indeed, errors during write operations (power cuts, etc.) will not lead to the corruption of the data of the inhibited bytes. However, the second alternative may lead to an over-programming of memory cells, rendering them more susceptible to degradations by hot carriers. This is not the case of the first alternative. The third alternative is not subject to any of the faults of the other two, at the cost of an additional measurement of the quantification of the programming (read in margin mode).

For all the embodiments, examples and alternatives presented hereinbefore, it will be noted that, since the inhibit voltage is transferred to sources of bytes belonging to the same column but to different rows, inhibit voltages that are too high may generate interference in the bytes of the neighbouring rows. In order to maintain a good level of safety, the difference in voltage between the sources of the non-selected rows and the control gate voltages of the non-selected rows does not exceed 4V. Since the control gate voltages in the non-selected rows are typically at 3V, erase inhibit potentials up to 7V may be provided.

The embodiments described hereinbefore may be applied to any given number of bytes per memory word greater than 2, right up to a full-page operation, in which the size of the word is an entire page, in other words all the memory cells of a row.

The embodiments described hereinbefore form an optimum compromise in terms of minimizing the surface areas occupied and the reliability of the EEPROM memory devices, in particular the reliability in terms of life expectancy and of retention of the data.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An electrically-erasable programmable read-only memory device comprising:
   a matrix memory plane arranged in rows and columns of memory words, each memory word comprising several bytes of memory cells;
   write circuitry configured to perform a write operation in response to receiving a command for writing at least one selected byte in at least one selected memory word of the matrix memory plane, wherein the write operation comprises an erase cycle followed by a programming cycle, wherein the write circuitry is configured for generating:
      during the erase cycle:
         an erase voltage in memory cells of all bytes of the at least one selected memory word, wherein the erase voltage is configured to cause the memory cells of the at least one selected memory word to be erased, and
         an erase inhibit potential configured relative to the erase voltage for preventing erasing of memory cells of non-selected bytes of the at least one selected memory word; and
      during the programming cycle, a programming voltage in previously programmed memory cells of at least one non-selected byte of the at least one selected memory word; and
   read circuitry configured for reading, during the write operation and prior to the erase cycle, data contained in the memory cells of the at least one non-selected byte of the at least one selected memory word;
   wherein the erase inhibit potential is configured so as to result, with respect to the erase voltage, in an erase alteration in the memory cells of the non-selected bytes of the at least one selected memory word, causing an incomplete erasing of these memory cells, in order to prevent complete erasing of the memory cells.

2. The device according to claim 1, wherein the memory cells each comprise a floating gate state transistor capable of storing a data value, sources of the state transistors being coupled to a source line common to the memory cells of the same byte and distinct from the source lines of the other bytes of the same memory word, the device comprising a source line decoder configured for selectively transmitting the erase inhibit potential in the source lines of the non-selected bytes of the at least one selected memory word.

3. The device according to claim 2, wherein the state transistors comprise a control gate, the control gates of the state transistors being coupled to a control gate line common to the memory cells of the same memory word, and the write circuitry is configured for generating, during the erase cycle, the erase voltage on the control gate line(s) of the at least one selected memory word.

4. The device according to claim 3, wherein the write circuitry is configured for generating, during the erase cycle, a ground reference potential in the source line(s) of the at least one selected byte.

5. The device according to claim 1, wherein each memory cell is coupled to a bit line, and the write circuitry is configured for generating, during the programming cycle, the programming voltage on the bit lines of the memory cells to be programmed.

6. The device according to claim 1, wherein the read circuitry is configured for reading previous data and measuring a quantification of programming of previously programmed memory cells in the at least one non-selected byte of the at least one selected memory word, and the write circuitry is configured for generating the programming voltage in the previously programmed memory cells of the at least one non-selected byte of the at least one selected memory word, in response to the quantification of the programming measured in these memory cells being less than a margin taken on a nominal value of the quantification of the programming.

7. An electrically-erasable programmable read-only memory device comprising:
   a matrix memory plane arranged in rows and columns of memory words, each memory word comprising several bytes of memory cells;
   write circuitry configured to perform a write operation in response to receiving a command for writing at least one selected byte in at least one selected memory word of the matrix memory plane, wherein the write operation comprises an erase cycle followed by a programming cycle, wherein the write circuitry is configured for generating:
      during the erase cycle:
         an erase voltage in memory cells of all bytes of the at least one selected memory word, wherein the erase voltage is configured to cause the memory cells of the at least one selected memory word to be erased, and
         an erase inhibit potential configured relative to the erase voltage for preventing erasing of memory cells of non-selected bytes of the at least one selected memory word; and
      during the programming cycle, a programming voltage in previously programmed memory cells of at least one non-selected byte of the at least one selected memory word; and
   read circuitry configured for:
      reading, during the write operation and prior to the erase cycle, data contained in the memory cells of the at least one non-selected byte of the at least one selected memory word, and
      reading previous data and measuring a quantification of programming of previously programmed memory cells in the at least one non-selected byte of the at least one selected memory word; and wherein the write circuitry is further configured for generating the programming voltage in the previously programmed memory cells of the at least one non-selected byte of the at least one selected memory word, in response to the quantification of the programming measured in these memory cells being less than a margin taken on a nominal value of the quantification of the programming.

8. The device according to claim 7, wherein the memory cells each comprise a floating gate state transistor capable of storing a data value, sources of the state transistors being coupled to a source line common to the memory cells of the same byte and distinct from the source lines of the other bytes of the same memory word, the device comprising a source line decoder configured for selectively transmitting the erase inhibit potential in the source lines of the non-selected bytes of the at least one selected memory word.

9. The device according to claim 8, wherein the state transistors comprise a control gate, the control gates of the state transistors being coupled to a control gate line common to the memory cells of the same memory word, and the write circuitry is configured for generating, during the erase cycle, the erase voltage on the control gate line(s) of the at least one selected memory word.

10. The device according to claim 9, wherein the write circuitry is configured for generating, during the erase cycle, a ground reference potential in the source line(s) of the at least one selected byte.

11. The device according to claim 7, wherein each memory cell is coupled to a bit line, and the write circuitry is configured for generating, during the programming cycle, the programming voltage on the bit lines of the memory cells to be programmed.

12. The device according to claim 7, wherein the erase inhibit potential is configured so as to result, with respect to the erase voltage, in a negligible erase alteration in the memory cells of the non-selected bytes of the at least one selected memory word, causing a negligible partial erasing of these memory cells, in order to prevent the erasing of the memory cells.

13. A method for writing in an electrically-erasable programmable read-only memory comprising a matrix memory plane arranged in rows and columns of memory words each comprising several bytes of memory cells, the method comprising:

receiving a command for writing at least one selected byte in at least one selected memory word of the matrix memory plane; and in response to receiving the command, performing a write operation comprising:

prior to an erase cycle, reading data contained in at least one non-selected byte of the at least one selected memory word;

the erase cycle, comprising:

generating an erase voltage in memory cells of all bytes of the at least one selected memory word, the erase voltage being able to cause the memory cells to be erased, and generating an erase inhibit potential configured with respect to the erase voltage for preventing erasing of memory cells of non-selected bytes of the at least one selected memory word; and a programming cycle comprising generating a programming voltage in previously programmed memory cells of the at least one non-selected byte of the at least one selected memory word, the erase inhibit potential resulting, with respect to the erase voltage, in an erase alteration in the memory cells of the non-selected bytes of the at least one selected memory word, causing an incomplete erasing of these memory cells, in order to prevent complete erasing of the memory cells.

14. The method according to claim 13, the memory cells of the memory each comprising a floating gate state transistor capable of storing a data value, sources of the state transistors being coupled to a source line common to the memory cells of the same byte and distinct from the source lines of the other bytes of the same memory word, the method comprising a decoding of source lines for selectively transmitting the erase inhibit potential in the source lines of the non-selected bytes of the at least one selected memory word.

15. The method according to claim 14, the state transistors comprising a control gate, the control gates of the state transistors being coupled to a control gate line common to the memory cells of the same memory word, in which the erase cycle comprises generating the erase voltage on the control gate line(s) of the at least one selected memory word.

16. The method according to claim 14, in which the erase cycle comprises generating a ground reference potential in the source line(s) of at least the selected byte.

17. The method according to claim 13, in which each memory cell is coupled to a bit line, and the programming cycle comprises generating the programming voltage on the bit lines of the memory cells to be programmed.

18. The method according to claim 13, in which the write operation comprises a reading and a measurement of a quantification of programming of previously programmed memory cells in the at least one non-selected byte of the at least one selected memory word, and generating the programming voltage in the previously programmed memory cells of the at least one non-selected byte of the at least one selected memory word, in response to the quantification of the programming measured in these memory cells being less than a margin taken on a nominal value of the quantification of the programming.

* * * * *